United States Patent
Ping-Chung et al.

(10) Patent No.: US 6,187,080 B1
(45) Date of Patent: Feb. 13, 2001

(54) EXHAUST GAS TREATMENT APPARATUS INCLUDING A WATER VORTEX MEANS AND A DISCHARGE PIPE

(75) Inventors: Chung Ping-Chung, Hsinchu; Lu Tsung-Lin, TaiNan; Chi-Hsien Chen, TaiTung; Jing-Yi Huang, Taipei; Ju-Long Lee, Keelung; Hunter Chung, Hsinchu; Chien-Feng Chen, KaoHsiung, all of (TW)

(73) Assignee: United Microelectronics Inc. (TW)

( * ) Notice: Under 35 U.S.C. 154(b), the term of this patent shall be extended for 0 days.

(21) Appl. No.: 09/370,487

(22) Filed: Aug. 9, 1999

(51) Int. Cl.[7] .................................................. B01D 53/14
(52) U.S. Cl. ................. 96/273; 96/306; 96/319; 96/372; 96/314
(58) Field of Search .............................. 96/273, 306, 314, 96/315, 316, 319, 372

(56) References Cited

U.S. PATENT DOCUMENTS

| | | | |
|---|---|---|---|
| 5,855,822 | * | 1/1999 | Chen . |
| 6,010,576 | * | 1/2000 | Lin . |
| 6,090,183 | * | 7/2000 | Awaji . |
| 6,095,063 | * | 8/2000 | Lee et al. . |
| 6,119,299 | * | 9/2000 | Lin . |

* cited by examiner

Primary Examiner—Chester T. Barry (57) ABSTRACT

An exhaust gas treatment apparatus for treating exhaust gas generated in semiconductor manufacturing processes. It includes a main pipe, a gas vortex means, a water vortex means, an U pipe and a discharge pipe. The main pipe transforms the exhaust gases to waste powder which are discharged out through the U pipe and the discharge pipe. The gas vortex means and water vortex means are located below the main pipe for generating annular and even downward gas flow and water flow at the outlet of the main pipe for preventing reflux of waste powder from entering into the main pipe. Waste powder thus won't deposit around the outlet. Scraper in the main pipe won't be stuck or deformed. Waste powder may be discharged out through the U pipe and discharge pipe smoothly and efficiently.

33 Claims, 6 Drawing Sheets

EXHAUST GAS TREATMENT APPARATUS INCLUDING A WATER VORTEX MEANS AND A DISCHARGE PIPE

BACKGROUND OF THE INVENTION

1. Field of the Invention

This invention relates to an exhaust gas treatment apparatus that includes a water vortex means and a discharge pipe and particularly to an exhaust gas treatment for treating exhaust gases generated in diffusion and deposition processes.

2. Description of the Prior Art

In semiconductor manufacturing process, a blank wafer has to go through hundreds of processes to equip it with function desired. The processes include diffusion, deposition, (particularly chemical vapor deposition, or CVD), etching and the like. These processes mostly require large amount of reaction gases, especially in the diffusion and deposition processes. While a small portion of the gases have reaction with the wafer, a great portion of the gases do not have reaction with the wafer and become exhaust gases. The exhaust gases mainly include $SiH_4$, $SiH_2Cl_2$, etc. They are highly toxic and should be properly treated to remove the toxicity to comply with industry standards before being discharged out.

In the semiconductor industry nowadays, a commonly used treatment method for these toxic exhaust gases, such as $SiH_4$, and $SiH_2Cl_2$, is to heat the exhaust gases to about 800° C. and to mix them with oxygen gas at high temperature to form a waste powder of $SiO_2$ compounds. The high temperature compounds then mix with cooling water to form a waste powder containing vapor and waste water for discharging. An exhaust gas treatment apparatus usually has to perform the function set forth above to handle the exhaust gases generated in the diffusion and deposition processes.

Figure 1:
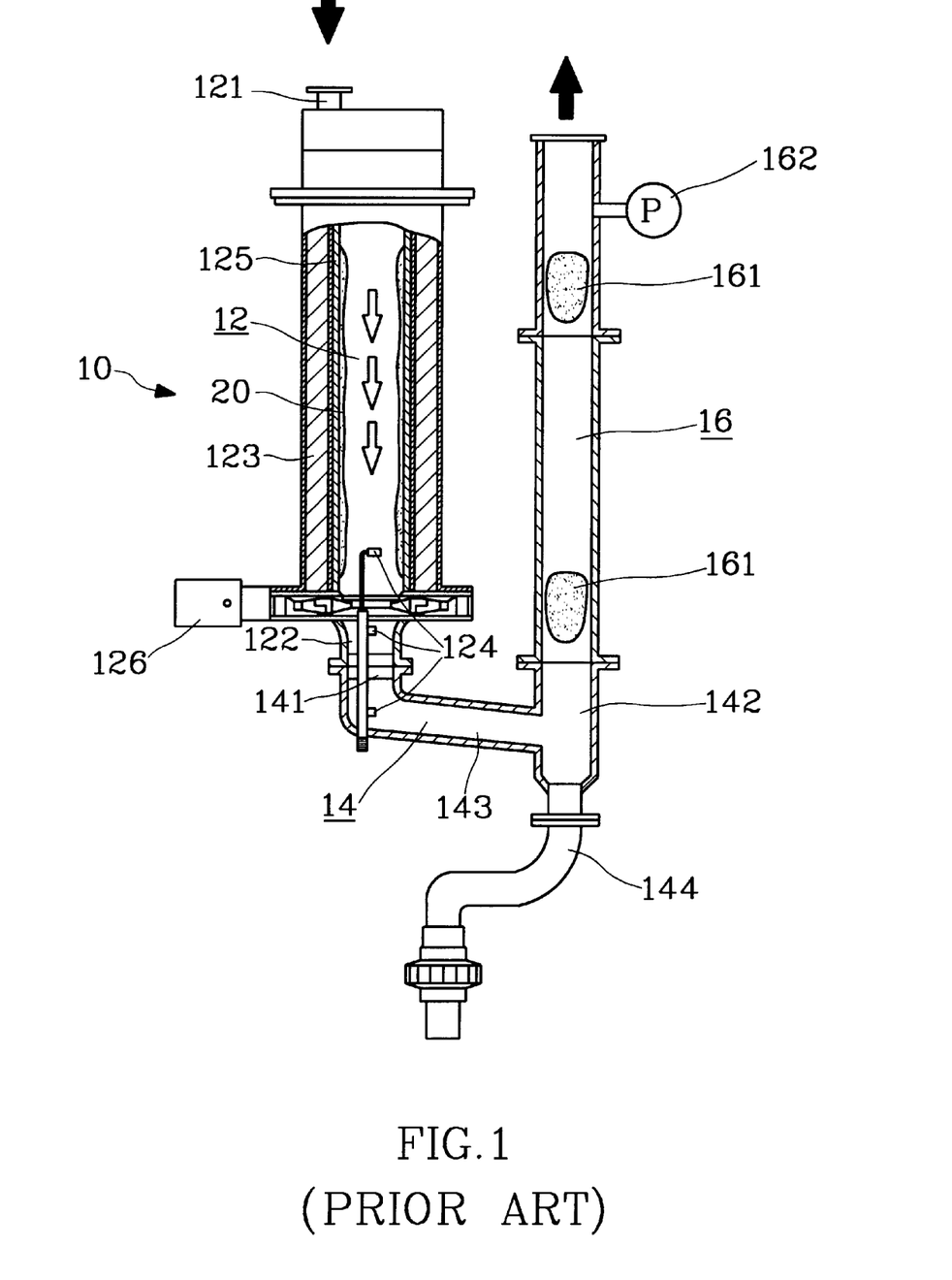
FIG. 1 is a schematic view of a conventional exhaust gas treatment apparatus.

FIG. 1 illustrates a conventional exhaust gas treatment apparatus 10 which includes a main pipe 12, an U pipe 14 and a discharge pipe 16.

The main pipe 12 includes an inlet 121 at an upper end thereof, an outlet 122 at a lower end, a heater 123 surrounding the main pipe 12, a sprinkler 124 consisting of a plurality of nozzles and being located at a lower portion of the main pipe 12 in the center for providing cooling water required for exhaust gas treatment, and a scraper 125 which has a plurality of scraping knives located at the inside wall of the main pipe 12. The scraper 125 is driven by a transmission means 126 for removing lump type exhaust gas powder 20 adhering to the inside wall of the main pipe 12.

The U pipe 14 includes a pipe body 143, a first connector 141 located at one end of the pipe body 143 and connected with a bottom end of the main pipe 12, a second connector 142 located at another end of the pipe body 143, and a drain 144 located below the second connector 142.

The discharge pipe 16 has a bottom end connecting with the second connector 142, filters 161 located inside for filtering exhaust gas, and a suction motor 162 to speed up exhaust gas treatment process.

Exhaust gases generated in the diffusion and deposition processes flow in the main pipe 12 through the inlet 121, are heated by the heater 123 to form high temperature exhaust gas powders after having reaction with oxygen gas. The exhaust gases powder are then cooled by cooling water from the sprinkler 124 to form waste powder containing vapor and waste water which enter into the U pipe 14 through the outlet 122 and the first connector 141. Vapor continues to flow through the second connector 142 and is discharged out through the discharge pipe 16. Waste water is discharged out through the drain 144.

However, when vapor and waste water that contain waste powder enter into the U-pipe 14, some of the vapor may be reflux into the main pipe 12. Waste powder contained in the vapor will accumulate around the outlet 122 and consequently shrink the diameter of the outlet 122. Furthermore, the lump type waste powder scraped from the inside wall of the main pipe 12 by the scraper 125 drops down to and easily clogs the U-pipe 14. All this makes exhaust gas discharge inefficient or difficult. Hence an exhaust gas treatment apparatus needs periodic preventive maintenance to clear the waste powder accumulated around the outlet 122 and in the U-pipe 14. The preventive maintenance frequency is usually two to four times per week. The time and frequency needed for preventive maintenance of an exhaust gas treatment apparatus becomes a serious drag on wafer production efficiency. An improvement in exhaust gas treatment can greatly enhance wafer production efficiency.

SUMMARY OF THE INVENTION

It is a main object of this invention to provide an exhaust gas treatment apparatus. The invention includes a water vortex means and a discharge pipe, which can prevent vapor from incurring reflux in the main pipe so that the outlet of the main pipe will be free from waste powder accumulation, the scraper won't stick or deform, and the U-pipe won't clog.

In one aspect of this invention, the apparatus includes a main pipe, a gas vortex means, a water vortex means, U pipe, and a discharge pipe. The main pipe, U pipe and discharge pipe are generally organized and constructed like the conventional one set forth above. The gas vortex means and the water vortex means are disposed between the main pipe and the U-pipe for respectively generating annular gas flow and water flow evenly downward. Vapor and waste water thus may be prevented from refluxing into the main pipe. Waste powder accumulation phenomenon and its ensuing problem may be avoided. The U pipe thus won't clog. The scraper won't stick or deform. The exhaust gas treatment efficiency may be maintained at a high level.

BRIEF DESCRIPTION OF THE DRAWINGS

The invention, as well as its many advantages, may be further understood by the following detailed description and drawings in which.

DETAILED DESCRIPTION OF THE PREFERRED EMBODIMENTS

Figure 2:
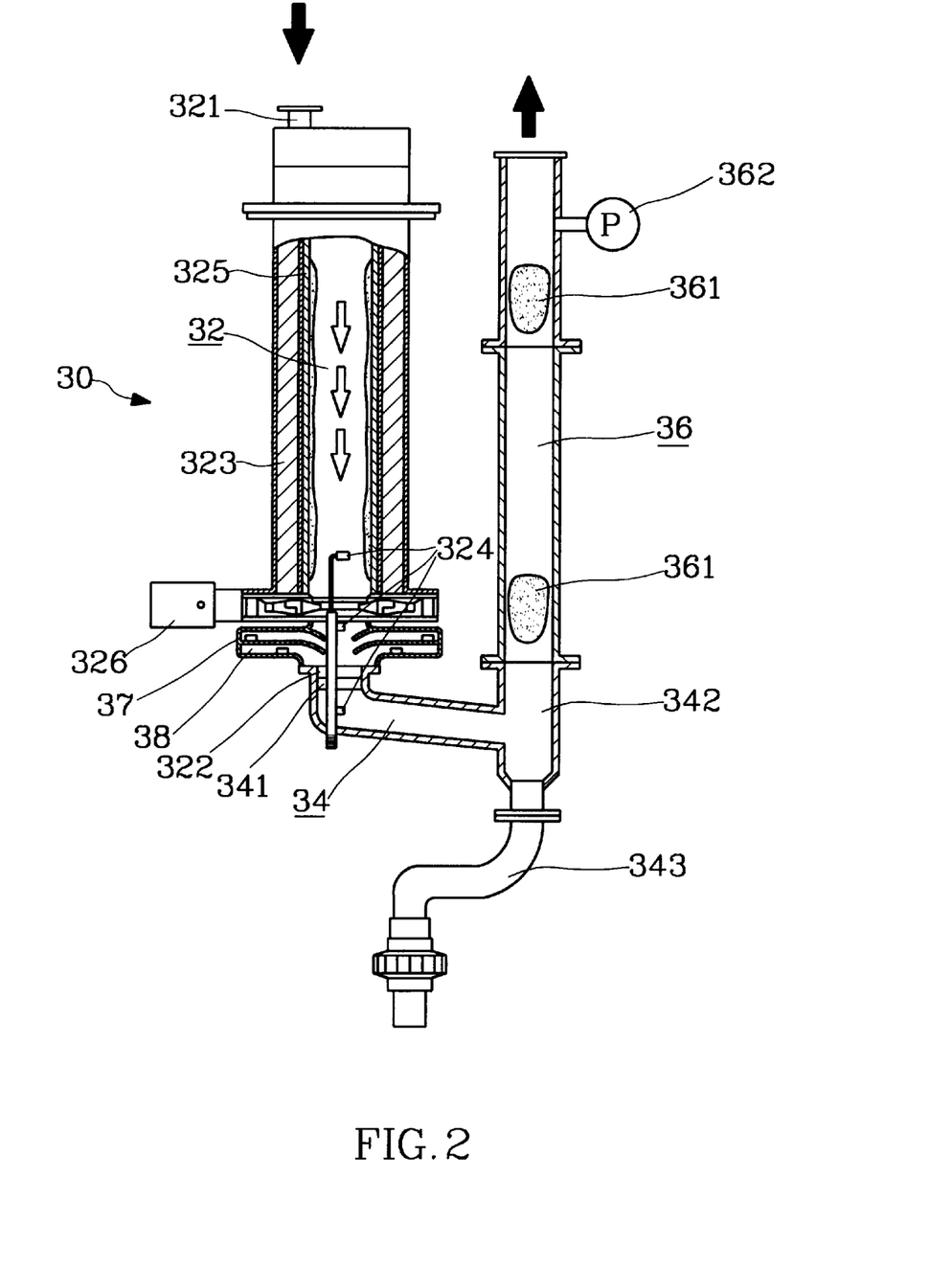
FIG. 2 is a schematic view of this invention.

Referring to FIG. 2, the exhaust gas treatment apparatus 30 according to this invention includes a main pipe 32, a U pipe 34, a gas vortex means 37, a water vortex means 38 and a discharge pipe 36.

The main pipe 32 includes an inlet 321 at an upper end thereof, an outlet 322 at a lower end, a heater 323 surrounding the main pipe 32, a sprinkler 324 consisting of a plurality of nozzles and being located at a lower portion of the main pipe 32 in the center for providing cooling water required for exhaust gas treatment, a scraper 325 which has a plurality of scraping knifes and being located at inside wall of the main pipe 32. The inside wall of the main pipe 32 further is covered with a water affinity film.

Exhaust gases flow into the main pipe 32 through the inlet 321, and being heated by the heater 323 to form a high temperature waste powder after reacting with oxygen gas. The waste powder is then cooled by cooling water from the sprinkler 324 to form vapor and waste water which will be discharged out through the U pipe 34 and the discharge pipe 36. Some of the waste powder forms a lump type waste powder 20 sticking to the inside wall of the main pipe 32. The scraper 325 driven by the transmission means 326 may be turned to remove the lump type waste powder 20 off the inside wall of the main pipe 32.

Figure 3A:
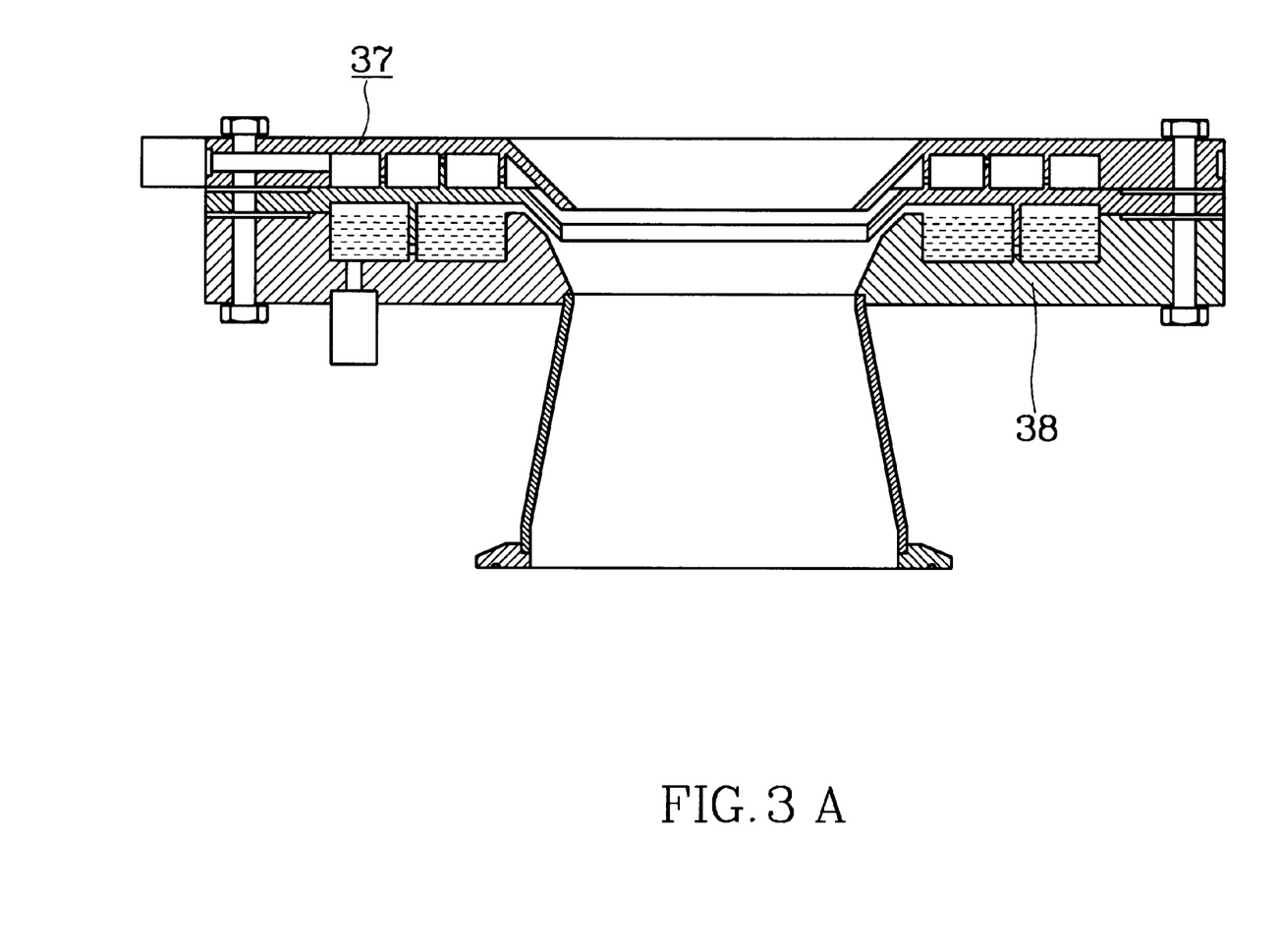
FIG. 3A is a sectional view of a gas vortex means and a water vortex means of this invention.
Figure 3B:
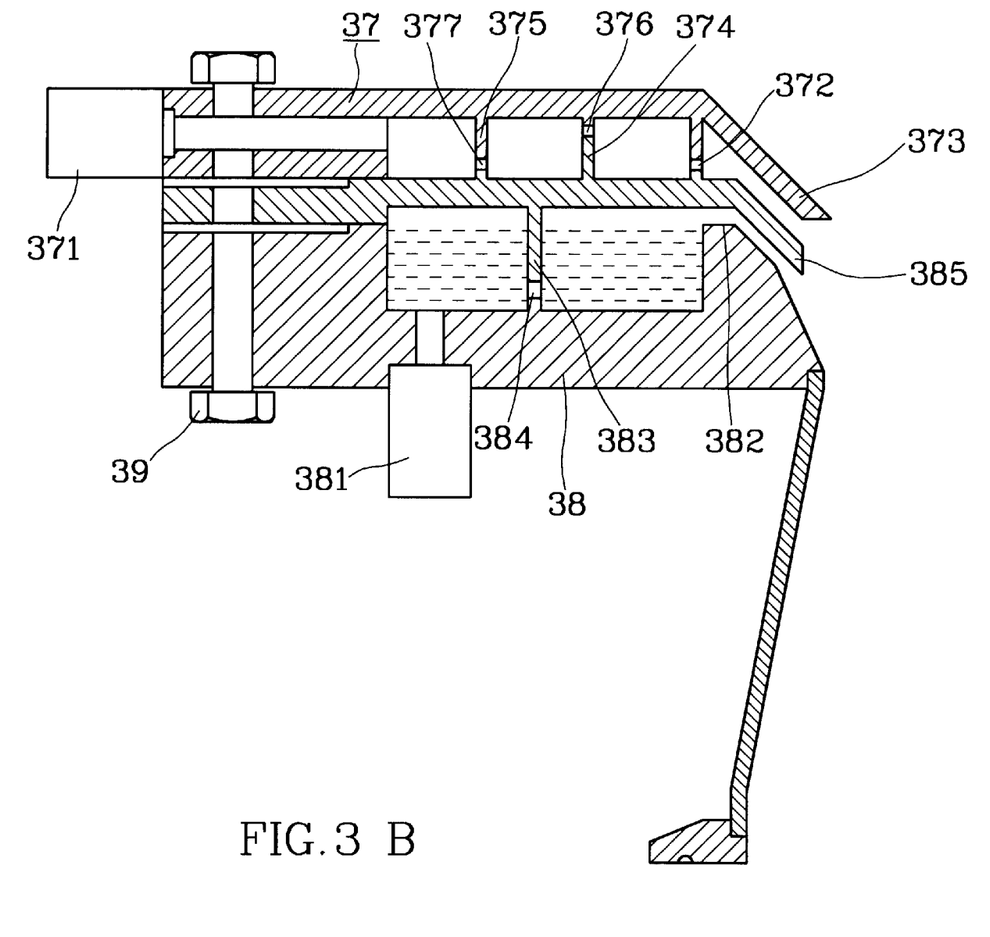
FIG. 3B is a fragmentary enlarged sectional view of a gas vortex means and a water vortex means shown in FIG. 3A.

Referring to FIGS. 2 AND 3A, the gas vortex means 37 is located below the transmission means 326 for providing the inside wall of the main pipe 32 with an annular and even downward gas flow. The gas may be nitrogen gas or dried clean air. The gas vortex means 37 is an annular and hollow structure, which has an outer side connecting with a gas source 371 at an upper section of the outer side. There is an annular inside wall in which a plurality of air ports 372 are formed. Above the air ports 372 there is an annular gas flow guide 373 which is slantly extended downward. Spaced from the inside wall where the air ports 372 are located and moving away from the axis of the main pipe, there is a first dividing wall 374 and a second dividing wall 375 (also referring to FIG. 3B) which have respectively through holes 376 and 377 formed at an upper section and at a lower section thereof. Gas flows from the gas source 371 through the through holes 376 and 377, and becomes an even annular gas flow to eject out through the air ports 372. The water vortex means 38 is also an annular and hollow structure engaged with the bottom of the air vortex means by means of screws 39 for providing an annular and even downward water flow. Water, preferably deionized water, is supplied by an external water source 381 from the outer circumference of the water vortex means 38. In the inside circumference, there is a plurality of water outlets 382. There is an annular water flow guide 385 located above the water outlets and which is slantly extended downward. There is also a dividing wall 383 located in the water vortex means. At a lower section of the dividing wall 383, there is a through hole 384. Water flows from the water supply 381 through the through hole 384 and becomes an annular and even water flow ejecting out through the water outlets 382.

Figure 3C:
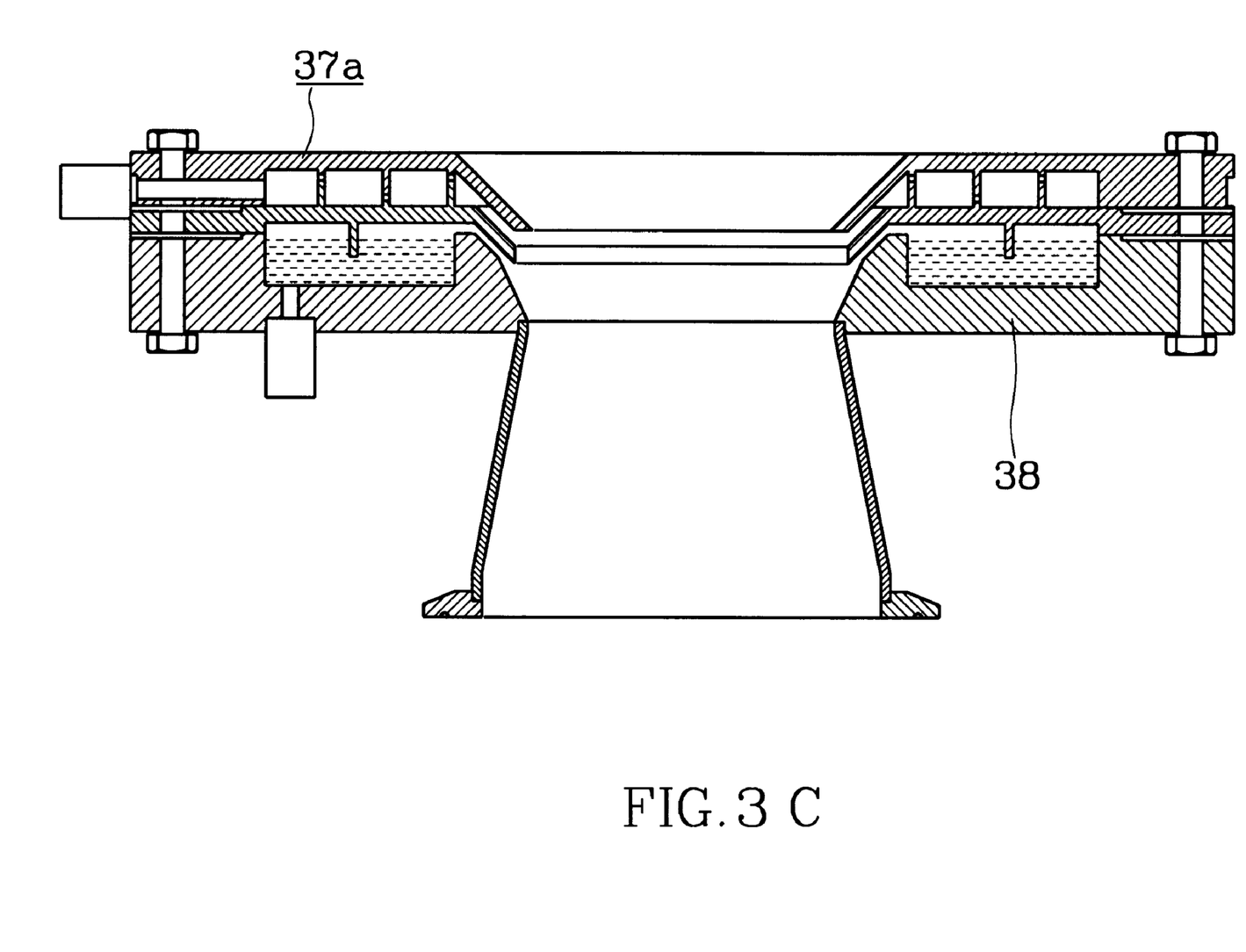
FIG. 3C is a sectional view of another embodiment of a gas vortex means and a water means and a water vortex means of this invention.
Figure 3D:
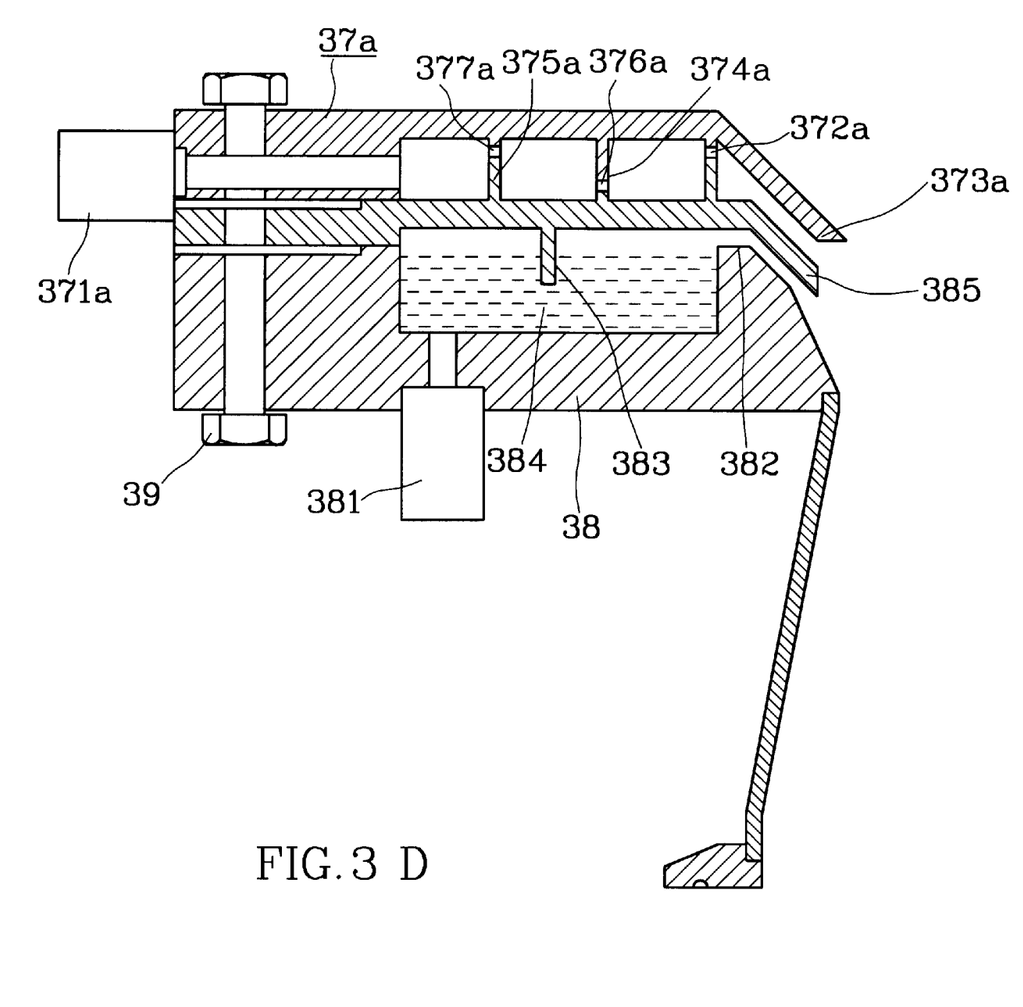
FIG. 3D is a fragmentary enlarged sectional view of a gas vortex means and a water vortex means shown in FIG. 3C.

Referring to FIGS. 3C and 3D, another embodiment of this invention is shown. It is substantially similar to the one shown in FIG. 3A. The gas vortex means 37a have the air ports 372a located at an upper section of the inside wall while the through hole 376a is located at a lower section of the first dividing wall 374a. The through hole 377a is located at an upper section of the second dividing wall 375. All other structures are substantially the same as the one shown in FIG. 3A. It also can produce an annular and even gas flow through the air ports 372a.

Referring again to FIG. 2, the U pipe 34 includes a first connector 341 located at one end and connected with the outlet 322 of the main pipe 32, and a second connector 342 located at another end to connect with the discharge pipe 36. There is a drain 343 located below the second connector 342.

The discharge pipe 36 has a bottom end connecting with the second connector 342, filters 361 located inside for filtering exhaust gases, and a suction motor 362 to speed up discharging of vapor.

Vapor and the waste water formed by cooling the waste powder enter in the U-pipe 34. Vapor is discharged out through the discharge pipe 36 while waste water is discharged out through the drain 343. Because of the gas vortex means 37 and water vortex means 38, an annular and downward gas flow and water flow will be produced and evenly hit the inside wall of the pipe, vapor reflux that might otherwise happen thus may be prevented from happening. Vapor may be discharged out smoothly without waste powder accumulating around the outlet 322. The scraper sticking or deformation problem and U-pipe clogging trouble may also be avoided.

In summary, this invention offers the following advantages;

a. The gas vortex means may generate annular and downward gas flow to prevent vapor reflux from entering into the main pipe. Waste powder contained in the vapor thus won't deposit around the outlet of the main pipe.

b. The water vortex means may generate annular and downward water flow to flush away waste powder contained in the vapor and prevent the waste powder depositing around the outlet of the main pipe.

c. The water affinity film covered the inside wall of the main pipe may enable water flow coming from the water vortex means to evenly cover the inside wall of the main pipe.

d. Scraper sticking and deformation or U-pipe clogging resulting from waste power accumulation may be avoided. The frequency and duration of preventive maintenance of wafer production facilities may be reduced. Wafer production efficiency may be increased.

It may thus be seen that the objects of the present invention set forth above herein, as well a those made apparent from the foregoing description, are efficiently attained. While the preferred embodiments of the invention have been set forth for purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. An exhaust gas treatment apparatus including a water vortex means and a discharge pipe for treating exhaust gas generated in diffusion and deposition steps in wafer production processes, comprising:

a main pipe including an inlet for receiving the exhaust gases, a scraper located on the inside wall of the main pipe, a transmission located at a lower portion of the main pipe and an outlet;

wherein exhaust gas forms waste powder which is discharged out through the outlet, the waste powder forming lump type waste power on the inside wall of the main pipe and being removed from the inside wall by the turning scraper;

a gas vortex means located below the transmission for generating an annular downward gas flow;

a water vortex means located below the gas vortex means for generating an annular downward water flow;

a U-pipe having a first connector connecting with the outlet and a second connector which has a drain located thereunder, the first and the second connector having respectively upward openings; and a discharge pipe connecting at one end thereof with the second connector.

2. The exhaust gas treatment apparatus of claim 1, wherein the gas vortex means is an annular hollow structure which has an outer side connecting with a gas source at an upper section of the outer side, an inside wall with a plurality of air ports formed therein at a lower section thereof, a first dividing wall spaced from the inside wall and a second dividing wall located between the first dividing wall and the outer side, the first dividing wall having a first through opening located at an upper section thereof, the second dividing wall having a second through opening located at a lower section thereof, gas from the gas source flowing through the first and second through openings to become an annular gas flow and being ejected out through the air ports.

3. The exhaust gas treatment apparatus of claim 1, wherein the gas vortex means is an annular hollow structure which has an outer side connecting with a gas source at an lower section of the outer side, an inside wall with a plurality of air ports formed therein at an upper section thereof, a first dividing wall spaced from the inside wall and a second dividing wall located between the first dividing wall and the outer side, the first dividing wall having a first through opening located at a lower section thereof, the second dividing wall having a second through opening located at an upper section thereof, gas from the gas source flowing through the first and second through openings to become an annular gas flow and being ejected out through the air ports.

4. The exhaust gas treatment apparatus of claim 2, wherein the gas vortex means has an annular gas flow guide located above the air ports and being extended downward for the ejected gas flowing out downward.

5. The exhaust gas treatment apparatus of claim 3, wherein the gas vortex means has an annular gas flow guide located above the air ports and being extended downward for the ejected gas flowing out downward.

6. The exhaust gas treatment apparatus of claim 1, wherein the gas source is nitrogen gas.

7. The exhaust gas treatment apparatus of claim 1, wherein the gas source is dried clean air.

8. The exhaust gas treatment apparatus of claim 1, wherein the water vortex means is an annular hollow structure which has an outer side connecting with a water source at a lower section of the outer side, an inside wall with a plurality of water outlets formed therein at an upper section, and a dividing wall spaced from the inside wall having a third through opening located at a lower section thereof, water from the water source flowing through the third through opening to become an annular and even water flow and being ejected out through the water outlets.

9. The exhaust gas treatment apparatus of claim 8, wherein the water means has an annular water flow guide located above the water outlets and being extended downward for the ejected water flowing out downward.

10. The exhaust gas treatment apparatus of claim 1, wherein the water in the water vortex means is deionized water.

11. The exhaust gas treatment apparatus of claim 1, wherein the gas vortex means and the water vortex means are fastened together by screws.

12. The exhaust gas treatment apparatus of claim 1, wherein the inside wall of the main pipe is covered by a water affinity film.

13. The exhaust gas treatment apparatus of claim 1, wherein a heater surrounds the main pipe for heating exhaust gas flowing in the main pipe to form waste powder.

14. The exhaust gas treatment apparatus of claim 1, wherein the main pipe has a sprinkler located at a lower section in the center thereof for spraying cooling water to cool down the waste powder.

15. The exhaust gas treatment apparatus of claim 1, wherein the discharge pipe has a suction motor to speed up the exhaust gas treatment process.

16. An exhaust gas treatment apparatus including a water vortex means for treating exhaust gas generated in diffusion and deposition steps in wafer production processes, comprising:

a main pipe including an inlet for receiving the exhaust gases, a scraper located on the inside wall of the main pipe, a transmission located at a lower portion of the main pipe and an outlet, wherein exhaust gas forms waste powder which is discharged out through the outlet, the waste powder forming lump type waste powder on the inside wall of the main pipe and being removed from the inside wall by the turning scraper;

a water vortex means located below the main pipe for generating an annular downward water flow;

a U-pipe having a first connector connecting with the outlet and a second connector which has a drain located thereunder, the first and the second connector having respectively upward openings; and a discharge pipe connecting at one end thereof with the second connector.

17. The exhaust gas treatment apparatus of claim 16, wherein the water vortex means is an annular hollow structure which has an outer side connecting with a water source at a lower section of the outer side, an inside wall with a plurality of water outlets formed therein at an upper section, and a dividing wall spaced from the inside wall having a through hole located at a lower section thereof, water from the water source flowing through the through hole to become an annular water flow and being ejected out through the water outlets.

18. The exhaust gas treatment apparatus of claim 17, wherein the water vortex means has an annular water flow guide located above the water outlets and being extended downward for the ejected water flowing out downward.

19. The exhaust gas treatment apparatus of claim 16, wherein the water in the water vortex means is deionized water.

20. The exhaust gas treatment apparatus of claim 16, wherein the inside wall of the main pipe is covered by a water affinity film.

21. The exhaust gas treatment apparatus of claim 16, wherein the main pipe is surrounded by a heater for heating exhaust gas flowed in the main pipe to form the waste powder.

22. The exhaust gas treatment apparatus of claim 16, wherein the main pipe has a sprinkler located at a lower section in the center thereof for spraying cooling water to cool down the waste powder.

23. An exhaust gas treatment apparatus including a discharge pipe for treating exhaust gas generated in diffusion and deposition steps in wafer production processes, comprising:

a main pipe including an inlet for receiving the exhaust gases, a scraper located on the inside wall of the main pipe, a transmission located at a lower portion of the main pipe and an outlet wherein exhaust gas forms waste powder which is discharged out through the outlet, the waste powder forming lump type waste powder on the inside wall of the main pipe and being removed from the inside wall by the turning scraper;

a gas vortex means located below the transmission for generating an annular and even downward gas flow;

a U-pipe having a first connector connecting with the outlet and a second connector which has a drain located thereunder, the first and the second connector having respectively upward openings; and a discharge pipe connecting at one end thereof with the second connector.

24. The exhaust gas treatment apparatus of claim 23, wherein the gas vortex means is an annular hollow structure which has an outer side connecting with a gas source at an upper section of the outer side, an inside wall with a plurality of air ports formed therein at a lower section thereof, a first dividing wall spaced from the inside wall and a second dividing wall located between the first dividing wall and the outer side, the first dividing wall having a first through opening located at an upper section thereof, the second dividing wall having a second through opening located at a lower section thereof, gas from the gas source flowing through the first and second through openings to become an annular gas flow and being ejected out through the air ports.

25. The exhaust gas treatment apparatus of claim 23, wherein the gas vortex means is an annular hollow structure which has an outer side connecting with a gas source at a lower section of the outer side, an inside wall with a plurality of air ports formed therein at a upper section thereof, a first dividing wall spaced from the inside wall and a second dividing wall located between the first dividing wall and the outer side, the first dividing wall having a first through opening located at a lower section thereof, the second dividing wall having a second through opening located at an upper section thereof, gas from the gas source flowing through the first and second through openings to become an annular and even gas flow and being ejected out through the air ports.

26. The exhaust gas treatment apparatus of claim 24, wherein the gas vortex means has an annular gas flow guide located above the air ports and being extended downward for the ejected gas flowing out downward.

27. The exhaust gas treatment apparatus of claim 25, wherein the gas vortex means has an annular gas flow guide located above the air ports and being extended downward for the ejected gas flowing out downward.

28. The exhaust gas treatment apparatus of claim 23, wherein the gas source is nitrogen gas.

29. The exhaust gas treatment apparatus of claim 23, wherein the gas source is dried clean air.

30. The exhaust gas treatment apparatus of claim 23, wherein the gas vortex means is an annular hollow structure which has an outer side connecting with a gas source at a lower section of the outer side, an inside wall with a plurality of gas outlets formed therein at an upper section, and a dividing wall spaced from the inside wall having a third through opening located at a lower section thereof, water from the water source flowing through the third through opening to become an annular and even gas flow and being ejected out through the gas outlets.

31. The exhaust gas treatment apparatus of claim 23, wherein the main pipe is surrounded by a heater for heating exhaust gas flowed in the main pipe to form the waste powder.

32. The exhaust gas treatment apparatus of claim 23, wherein the main pipe has a sprinkler located at a lower section in the center thereof for spraying cooling water to cool down the waste powder.

33. The exhaust gas treatment apparatus of claim 23, wherein the discharge pipe has a suction motor to speed up the exhaust gas treatment process.

* * * * *